United States Patent
Haq

(10) Patent No.: US 6,327,205 B1
(45) Date of Patent: Dec. 4, 2001

(54) SIGNAL LATCHING OF HIGH BANDWIDTH DRAM ARRAYS WHEN SKEW BETWEEN DIFFERENT COMPONENTS IS HIGHER THAN SIGNAL RATE

(75) Inventor: Ejaz Ul Haq, Sunnyvale, CA (US)

(73) Assignee: Jazio, Inc., San Jose, CA (US)

( * ) Notice: Subject to any disclaimer, the term of this patent is extended or adjusted under 35 U.S.C. 154(b) by 0 days.

(21) Appl. No.: 09/578,354

(22) Filed: May 24, 2000

Related U.S. Application Data

(60) Provisional application No. 60/180,236, filed on Feb. 4, 2000, and provisional application No. 60/078,213, filed on Mar. 16, 1998.

(51) Int. Cl.[7] .................. G11C 7/00; G06F 3/00
(52) U.S. Cl. .................. 365/219; 365/189.04; 710/29; 710/33
(58) Field of Search ................ 365/219, 189.02, 365/189.04; 710/29, 33, 34, 35

(56) References Cited

U.S. PATENT DOCUMENTS

| | | | |
|---|---|---|---|
| 3,737,788 | 6/1973 | Lenz | 328/118 |
| 4,247,817 | 1/1981 | Heller | 324/73 |
| 4,663,769 | 5/1987 | Krinock | 375/110 |
| 4,675,558 | 6/1987 | Serrone | 307/527 |
| 4,745,365 | 5/1988 | Ugenti | 328/147 |
| 4,792,845 | 12/1988 | Judge | 358/10 |
| 4,942,365 | 7/1990 | Satterwhite | 328/134 |
| 4,987,572 | * 1/1991 | Scott | 370/91 |
| 5,023,488 | 6/1991 | Gunning | 307/475 |
| 5,105,107 | 4/1992 | Wilcox | 307/475 |

(List continued on next page.)

FOREIGN PATENT DOCUMENTS

WO92/17938   10/1992  (WO) .

OTHER PUBLICATIONS

"IEEE Standard For Low–Voltage Differential Signals (LVDS) For Scalable Coherent Interface (SCI)", IEEE Std. 1596.3–1996, Mar. 21, 1996, XP002106653, Introduction, Contents and pp. 1–30.

4M×18 SLDRAM Preliminary Data Sheet 9/97 from SLDRAM Consortium.

1M×16×4 Banks DDR SDRAM 6/97 from Samsung.

Kim et al. "A 640MB/s Bi–Dimensional Data Strobed,, Double–Data Rate SDRAM with a 40mw DLL Circuit for a 256MB Memory System", ISSCC98 Digest pp. 158–159 Feb. 1998.

Morooka et al., "Source Synchronization and Timing Vernier Techniques for 1.2GB/s SLDRAM Interface", ISSCC98 Digest pp. 160–161 Feb. 1998.

B. Lau et al. "A 2.6GB/s/Multi–Purpose Chip–to–Chip Interface", ISSCC98 Digest pp. 162–163 Feb. 1998.

LVDS I/O (Scalable Coherent Interface Documents) IEEE P1596.3 working–group activity for high–speed signal link interface.

Hyper–LVDS I/O Cells (LSI Logic Product Briefs).

(List continued on next page.)

Primary Examiner—Son Mai
(74) Attorney, Agent, or Firm—Squire, Sanders & Dempsey

(57) ABSTRACT

A system enables the capture of incoming signals from different components when the skew between the different components is higher than the signal rate. The system comprises a first port for serially receiving a first signal at a signal rate from a first component; a second port for serially receiving a second signal at the signal rate from a second component; a first serial-to-parallel conversion circuit for performing serial-to-n-bit-parallel conversion of the first signal, n being greater than one; and a second serial-to-parallel conversion circuit for performing serial-to-n-bit parallel conversion of the second signal.

30 Claims, 18 Drawing Sheets

U.S. PATENT DOCUMENTS

| | | | |
|---|---|---|---|
| 5,243,703 | 9/1993 | Farmwald et al. | 395/325 |
| 5,254,883 | 10/1993 | Horowitz et al. | 307/443 |
| 5,263,049 | 11/1993 | Wincn | 375/36 |
| 5,303,200 | 4/1994 | Elrod et al. | 365/230.05 |
| 5,319,755 | 6/1994 | Farmwald et al. | 395/325 |
| 5,355,391 | 10/1994 | Horowitz et al. | 375/36 |
| 5,363,332 | 11/1994 | Murabayashi et al. | 365/189.08 |
| 5,378,946 | 1/1995 | Reime | 327/14 |
| 5,408,129 | 4/1995 | Farmwald et al. | 257/692 |
| 5,432,823 | 7/1995 | Gasbarro et al. | 375/356 |
| 5,455,831 * | 10/1995 | Bartow et al. | 371/1 |
| 5,473,575 | 12/1995 | Farmwald et al. | 365/230.06 |
| 5,473,635 | 12/1995 | Chevroulet | 375/287 |
| 5,498,985 | 3/1996 | Parle et al. | 327/74 |
| 5,512,853 | 4/1996 | Ueno et al. | 327/333 |
| 5,513,327 | 4/1996 | Farmwald et al. | 395/309 |
| 5,513,377 | 4/1996 | Capowski et al. | 395/881 |
| 5,550,496 | 8/1996 | Desroches | 327/108 |
| 5,579,492 | 11/1996 | Gay | 395/290 |
| 5,590,369 | 12/1996 | Burgess et al. | 395/800 |
| 5,606,717 | 2/1997 | Farmwald et al. | 395/856 |
| 5,646,642 | 7/1997 | Maekawa et al. | 345/99 |
| 5,706,484 | 1/1998 | Mozdzen et al. | 395/551 |
| 5,715,405 | 2/1998 | McClear et al. | 395/280 |
| 5,774,354 | 6/1998 | Ohta | 364/131 |
| 5,796,962 | 8/1998 | Fant et al. | 395/306 |
| 5,878,234 | 3/1999 | Dutkiewicz et al. | 395/290 |
| 5,887,039 | 3/1999 | Suemura et al. | 375/365 |
| 5,925,118 | 7/1999 | Revilla et al. | 710/110 |
| 5,928,343 | 7/1999 | Farmwald et al. | 710/104 |
| 5,964,845 * | 10/1999 | Braun et al. | 709/400 |
| 6,084,823 | 7/2000 | Suzuki et al. | 365/233 |

OTHER PUBLICATIONS

Richard Crisp, "Direct Rambus Technology: The New Main Memory Standard", Nov./Dec. 1997 issue of IEEE Micro.

Direct RDRAM 64/72Mbit (256K×16/18×16d), "Advance Information" of 64M/72M Direct RDRAM Data Sheet, dated Oct. 2, 1997.

Tamura et al., "PRD–Based Global–Mean–Time Signaling for High–Speed Chip–to–Chip Communications", ISSCC98 Digest, pp. 164–165 & pp. 430–432; Feb. 1998.

Griffin et al., "A Process Independent 800MB/s DRAM Bytewide Interface Featuring Command Interleaving and Concurrent Memory Operation", ISSCC98 Digest, pp. 156–157 Feb. 1998.

RamLink, LVDS I/O (Scalable Coherent Interface Documents) IEEE P1596.4 working–group activity for high –speed signal link interface.

Xilinx Application Note: "Using the Virtex SelectIO", XAPP 133 Oct. 21, 1998 (Version 1.11), 12 pages.

Rambus, Rambus Technology Overview:, including Introduction and The Rambus Solution, Copyright, Feb. 1999, last modified: Feb. 12, 1999, 5 pages.

* cited by examiner

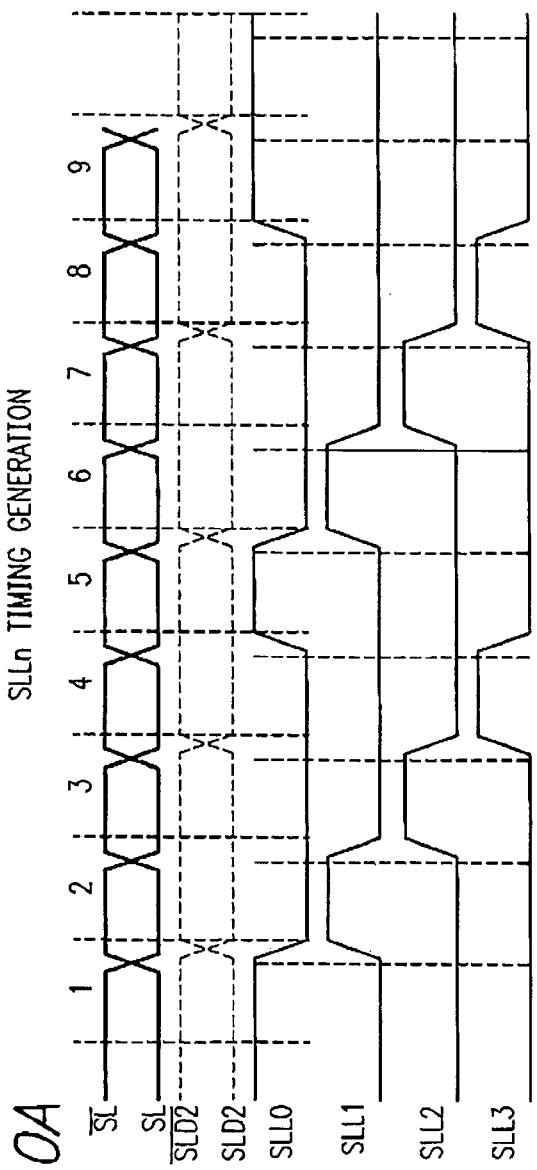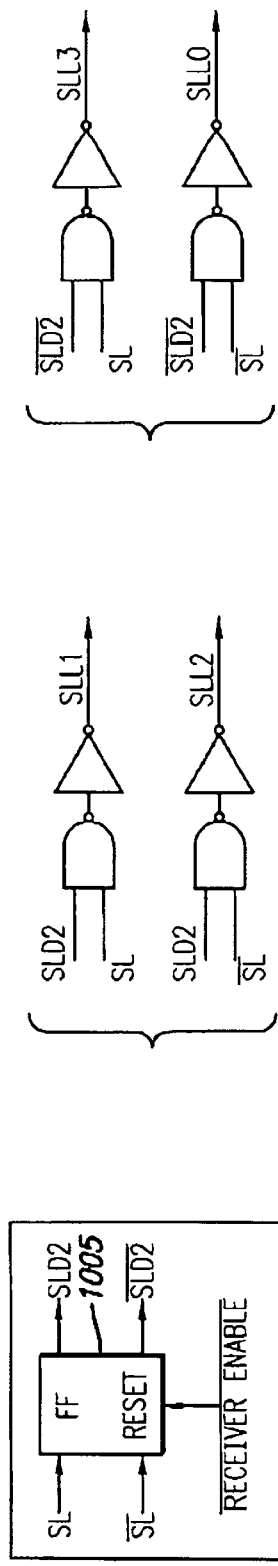
FIG. 10A
FIG. 10B
FIG. 10C
FIG. 10D

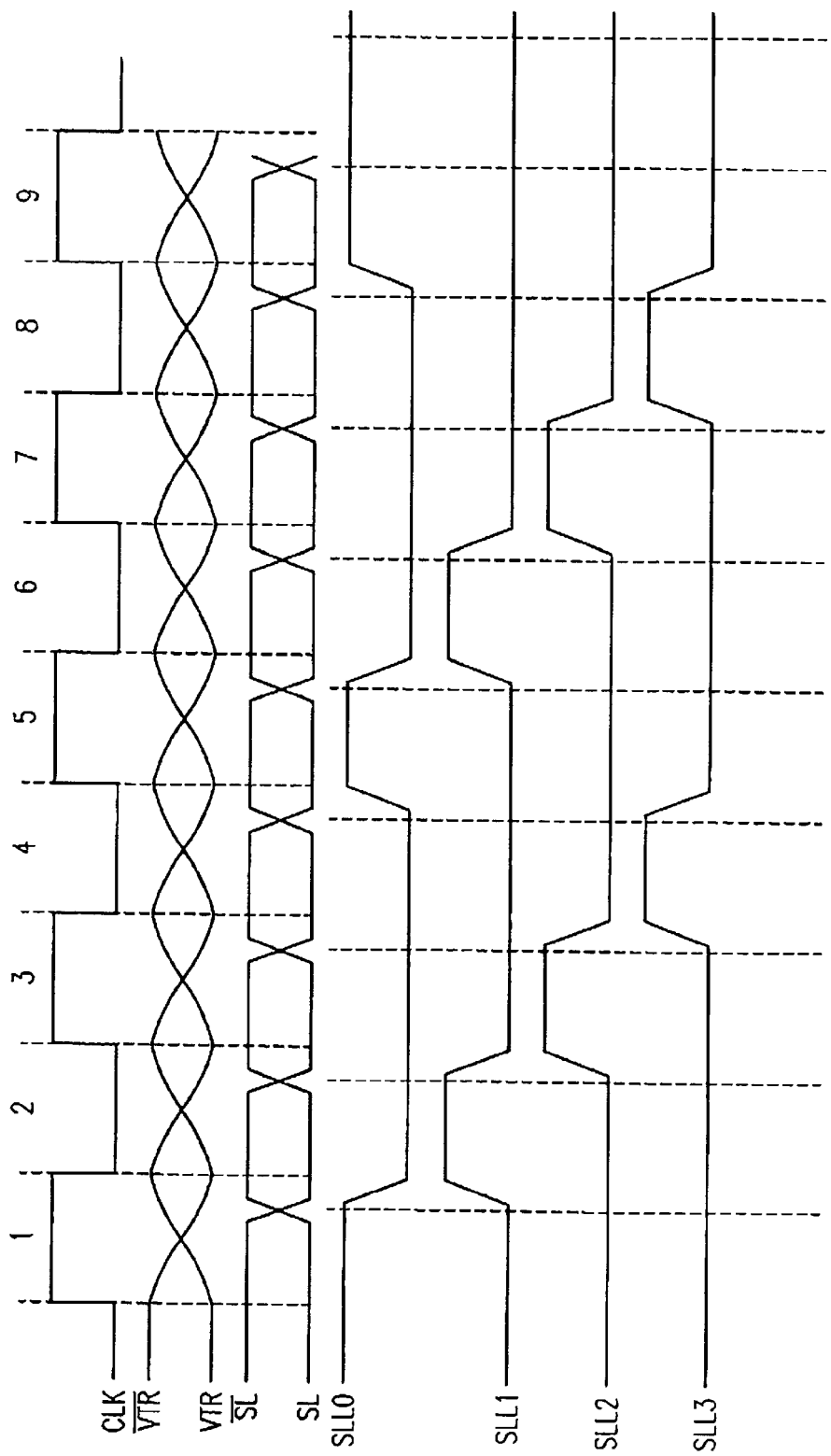
FIG. 14  READ DATA LATCHING FOR 8-BIT BURST

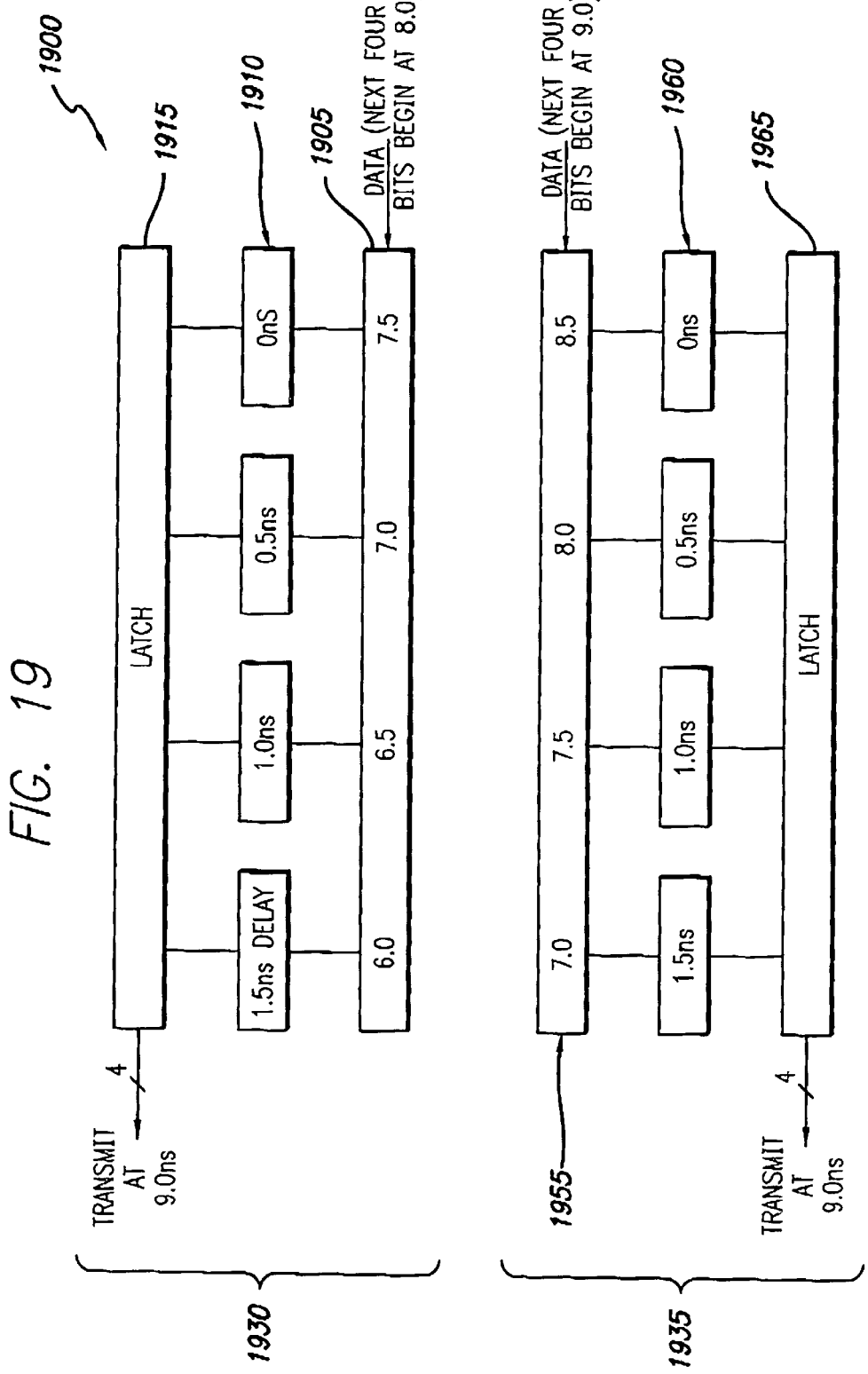

SIGNAL LATCHING OF HIGH BANDWIDTH DRAM ARRAYS WHEN SKEW BETWEEN DIFFERENT COMPONENTS IS HIGHER THAN SIGNAL RATE

CROSS-REFERENCE TO RELATED APPLICATIONS

This application incorporates by reference provisional patent application Ser. No. 60/078,213, entitled "High Speed Source Synchronous Signaling For Interfacing VLSI CMOS Circuits To Transmission Lines," filed on Mar. 16, 1998, by inventor Ejaz Ul Haq. This application claims benefit of and incorporates by reference patent application Ser. No. 09/057,158, entitled "High Speed Source Synchronous Signaling For Interfacing VLSI CMOS Circuits To Transmission Lines," filed on Apr. 7, 1998, by inventor Ejaz Ul Haq; patent application Ser. No. 09/165,705, entitled "High Speed Signaling for Interfacing VLSI CMOS circuits," filed on Oct. 2, 1998, by inventor Ejaz Ul Haq; patent application Ser. No. 09/318,690, entitled "High Speed Signaling for Interfacing VLSI CMOS Circuits," filed on May 25, 1999, by inventor Ejaz Ul Haq; and provisional patent application Ser. No. 60/180,236, entitled "Signal Latching of High Bandwidth DRAM Arrays When Skew Between Different Components is Higher than Signal Rate," filed on Feb. 4, 2000, by inventor Ejaz Ul Haq.

BACKGROUND OF THE INVENTION

1. Field of the Invention

This invention relates generally to high-bandwidth communication using CMOS integrated circuits, and more particularly to a system for communicating between circuit components.

2. Background of the Invention

Semiconductor integrated circuits used in digital computing and other digital applications often use a plurality of VLSI circuits interconnected by single or multi-segmented transmission lines for binary communication. Conventional transmission lines include traces, which are formed on a suitable substrate, such as a printed circuit board (PCB). In higher performance memory systems, the data is sent as a burst on both edges of the clock to reduce power and increase the peak bandwidth in DDRDRAMs and RDRAMs. To build large and wide data busses, conventional memory systems use multiple DRAM components. However, the variation between the individual DRAM components can be large, especially if different vendors manufacture the components. This limits the operating frequency of these large memory systems.

Further, with the advent of data communication techniques that offer data transfer rates greater than one gigahertz, skew between circuit (e.g., DRAM) components becomes even more troublesome. Examples of data communication techniques offering data transfer rates over one gigahertz are described in the copending patent applications identified above in the cross-reference to the related applications. It will be appreciated that this problem gets worse as the operating frequency of integrated circuits increases according to Moore's Law, without comparable improvement in packaging and printed circuit boards technology.

Thus, there is now a need for a system and method for transmitting, receiving and synchronizing data between multiple DRAM components at high frequency even when the skew between different components is higher than the data rate.

SUMMARY

The system and method enables the capture of incoming signals from different components when the skew between the different components is higher than the signal rate. The system and method use VTR and /VTR to latch the data or the signals from the same group on every edge and combine them with a serial-to-parallel conversion to allow lower frequency operation inside the DRAM core logic. When multiple VTRs are used for wider memory systems, the latching is done with the system clock after the serial-to-parallel conversion, thereby allowing for skew between multiple VTRs.

A system in accordance with an embodiment of the present invention comprises a first port for serially receiving a first signal at a signal rate from a first component; a second port for serially receiving a second signal at the signal rate from a second component; a first serial-to-parallel conversion circuit for performing serial-to-n-bit-parallel conversion of the first signal, n being greater than one; and a second serial-to-parallel conversion circuit for performing serial-to-n-bit parallel conversion of the second signal.

A method in accordance with an embodiment of the present invention includes serially receiving a first signal at a signal rate from a first component; serially receiving a second signal at the signal rate from a second component; performing serial-to-n-bit-parallel conversion of the first signal, n being greater than one; and performing serial-to-n-bit parallel conversion of the second signal.

BRIEF DESCRIPTION OF THE DRAWINGS

FIG. 10 is the circuit diagram for SLLn timing generation for read data latching in 4-bit serial-to-parallel conversion in the controller.

FIG. 14 is the timing diagram of latching an 8-bit burst.

FIG. 19 is a block and timing diagram illustrating the delays for proper latching of signals where the skew is greater than the signal rate.

DETAILED DESCRIPTION

The following description is provided to enable any person skilled in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein. It will be appreciated that the term "signal" herein is intended to include data, address, control or other information bits.

Memory systems usually have a master, i.e., a memory controller having most of the intelligence, and multiple slaves, i.e., memory banks such as DRAMs. The memory controller makes requests to read data out of a memory bank by sending a read request and an address to the memory banks, or requests to write data to a memory bank by sending a write request, an address and data to the memory banks. To improve performance or to fetch a full cache line from the memory to a local cache or buffer, many current memory systems use a burst of reads and writes to consecutive locations in the memory banks.

Figure 1:
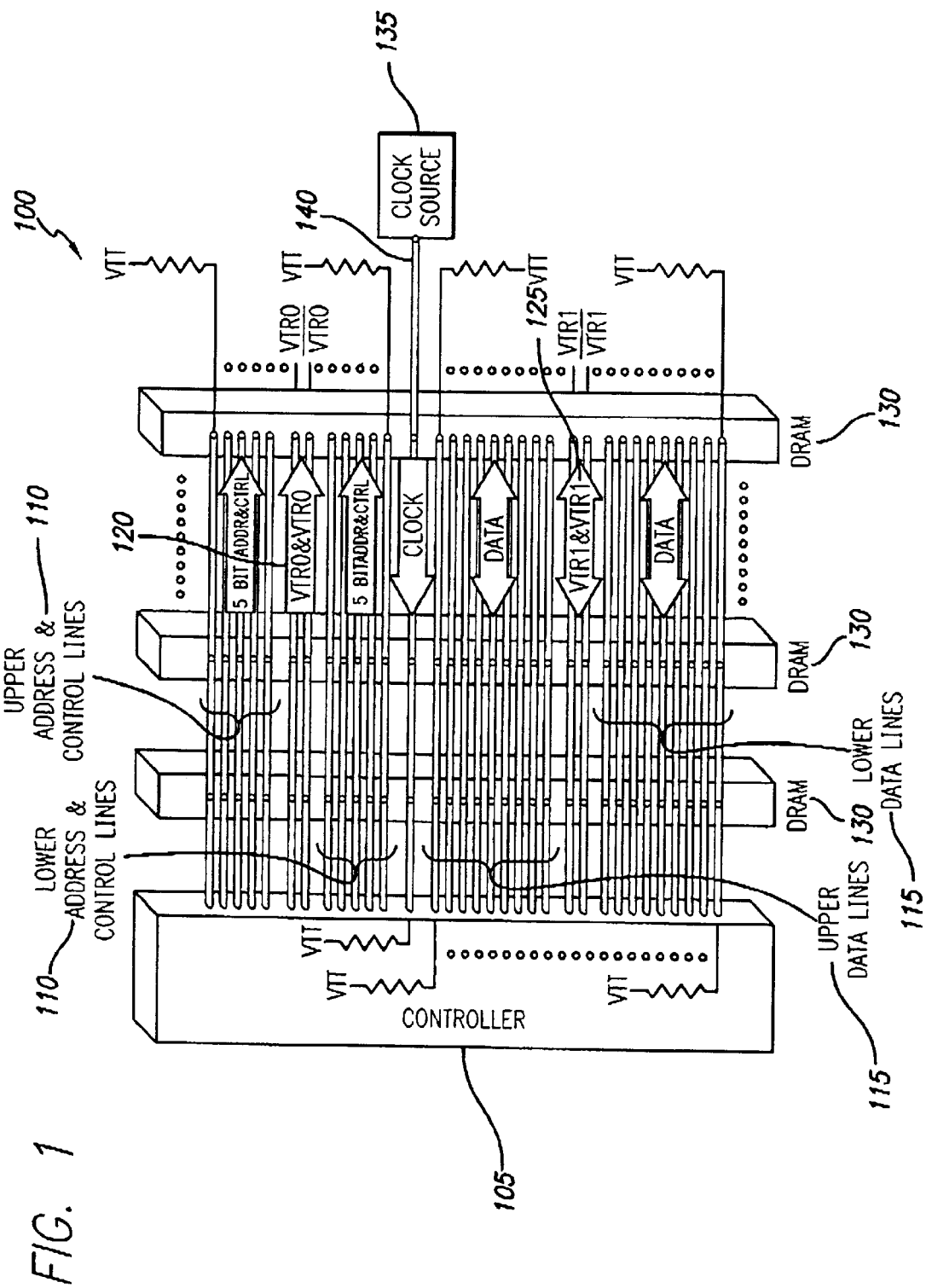
FIG. 1 is a block diagram of a memory system using a memory controller as a master and DRAMs as slaves.

FIG. 1 shows a simple memory system 100 that has a memory controller 105 connected to a 10-bit address and control bus 110 with VTR0 and /VTR0 120, to an 18-bit data bus 115 with VTR1 and /VTR1 125, and to multiple DRAMs 130. The first two lines of the address and control bus 110 may be used for commands, with the first line for sending /CS and /RAS on each VTR edge for row activation and the next line for sending /CAS and /WE for read or write requests. A clock source 135 sends a differential clock signal on a clock bus 140 via the DRAMs 130 to the memory controller 105. The clock source 135 is located at the opposite end from the memory controller 105, so that data read from the DRAMs 130 travels in the same direction as the clock signal and to compensate for flight time from the different DRAMs 130. The address and control bus 110 with the VTR0 and /VTR0 120 are unidirectional. Thus, the lines terminate at the end away from the memory controller 105. The 18-bit data bus 115 with VTR1 and /VTR1 125 are bi-directional. Thus, the lines terminate on both ends. There may be other pins for Receiver Enable or expansion.

Figure 2:
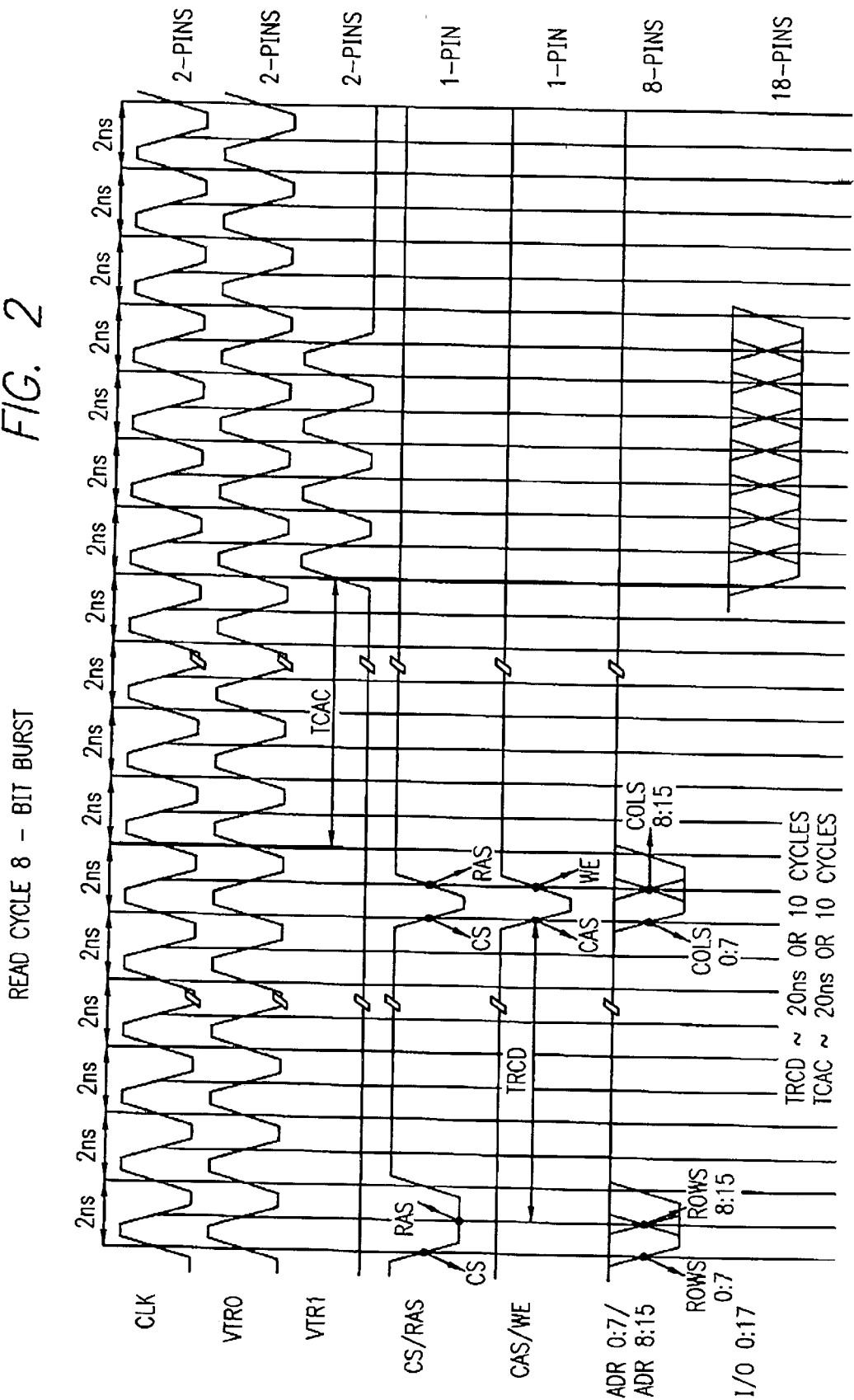
FIG. 2 is a timing diagram of a read cycle for an 8-bit burst of the memory system of FIG. 1.

Both VTR0 and /VTR0 signals derive from the clock signal. A DLL (not shown) in the controller 105 maintains the VTR0 and /VTR0 signals with the same phase and frequency as the clock signal at the memory controller 105 end. For applications where the data burst is longer than the address or command request, the VTR0 and /VTR0 signals may have half or one-fourth of the clock frequency. The 16-bit row address is sent on 8 pins on both edges with the /CS and /RAS signals as shown in FIG. 2. Similarly, the column or block address is sent on the same 8 pins with /CAS and /WE for write request and /WE high for read request. The timing diagram shows a 500 Mhz clock with signal transition on both edges for an effective rate 1 Gbit/sec/pin. The delay between row to column address is 20 ns or 10 clock cycles and the read latency from /CAS is 20 ns, which is normal with the current DRAM technology. The data appears on the I/O pins after 10 cycles on the positive edge of VTR1. VTR1 and /VTR1 are driven with the data from the requested DRAM and they travel together at the same time with similar transition time. The VTR1 and /VTR1 transition as long as the data is being sent or received between the controller and any one of the slaves on the I/O pins. It will be appreciated that the VTR1 signal can be high or low when data is not being transferred, but, in this embodiment, has to be low before the valid data starts to be transferred.

Figure 3:
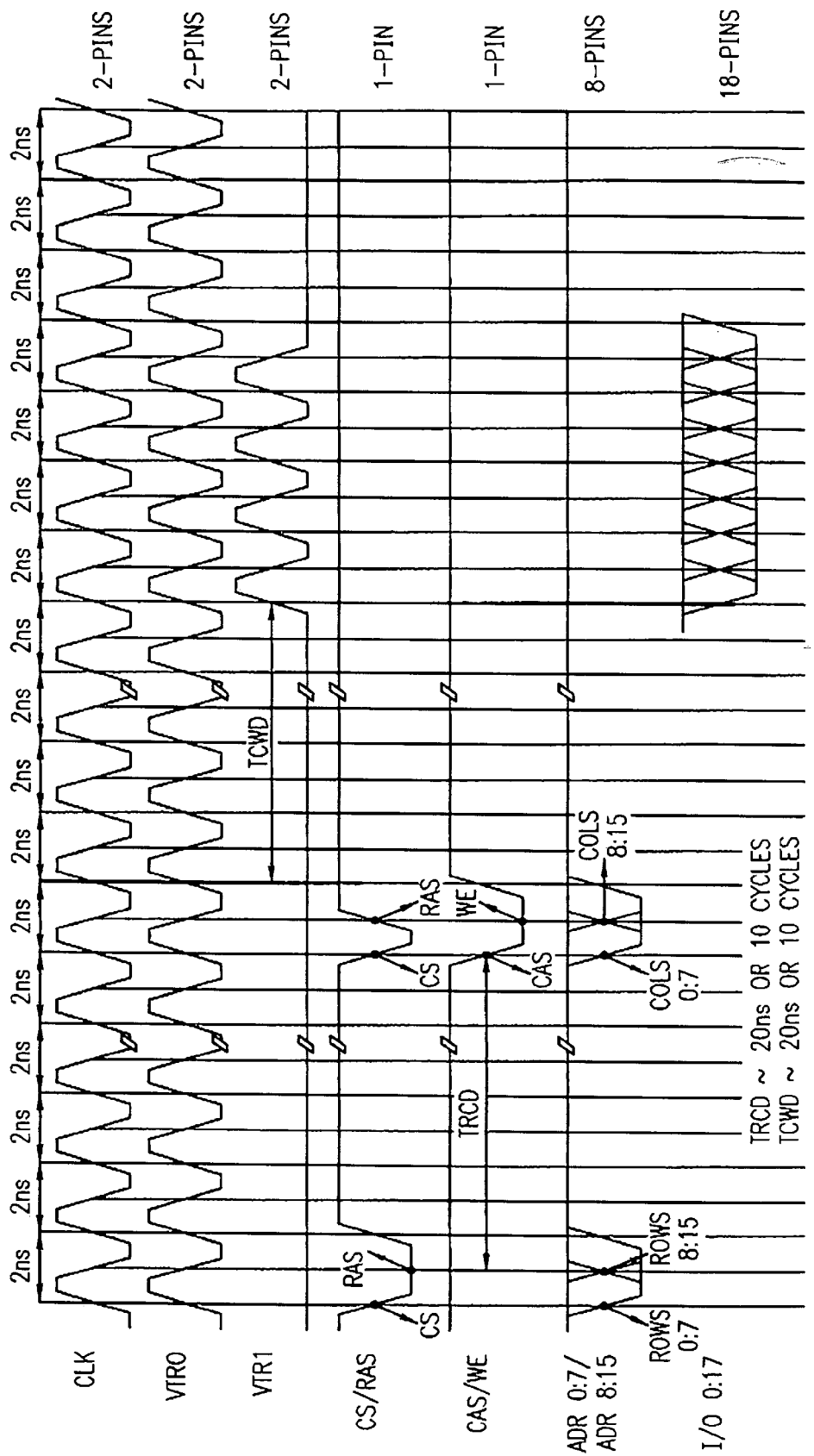
FIG. 3 is a timing diagram of a write cycle for an 8-bit burst of the memory system of FIG. 1.
Figure 4:
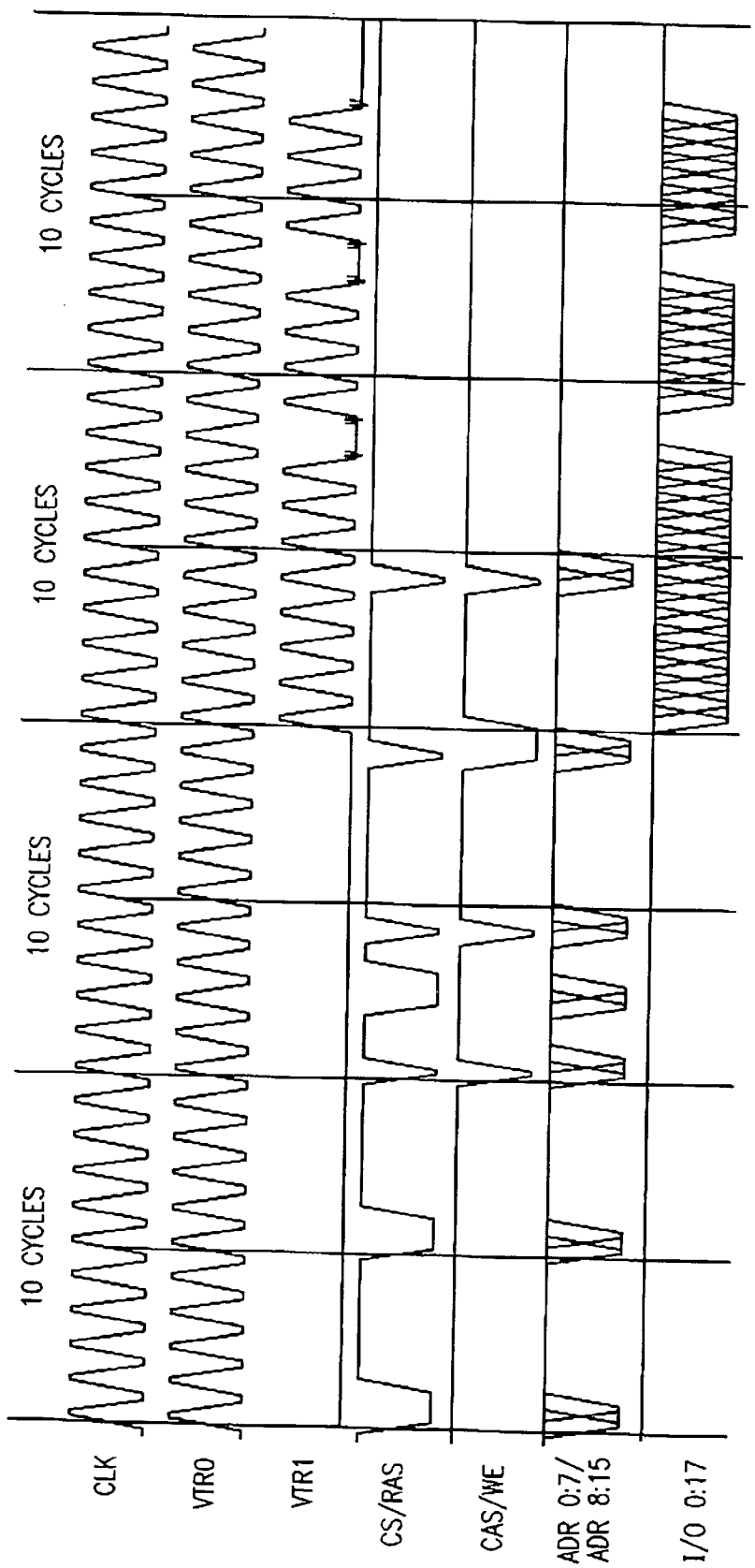
FIG. 4 is a timing diagram of read and write cycles of the memory system of FIG. 1.

FIG. 3 shows the write cycle, which is similar to the read cycle except that the data is coming from the controller 105 on the I/O pins. The VTR1 and /VTR1 are also driven by the controller 105 at the same time with similar signal transition times. The read and write latency is usually the same for ease of system design, but can be off by one or two cycles for better bus efficiency. FIG. 4 is a timing diagram showing a read, read from the same DRAM, followed by a one-cycle bus turnaround gap for a write cycle. Another read cycle after a one-cycle gap for bus turnaround again follows the write cycle. Usually there is one cycle gap whenever the data source is changed from one DRAM to another DRAM. This is done to settle the bus and initialize the receiver. Also, the signals are initiated on the positive edge of the VTRs and are an even number of bits in the burst, e.g., two bits for address and command and eight bits for data for convenience and easier Receiver Enable.

Figure 5:
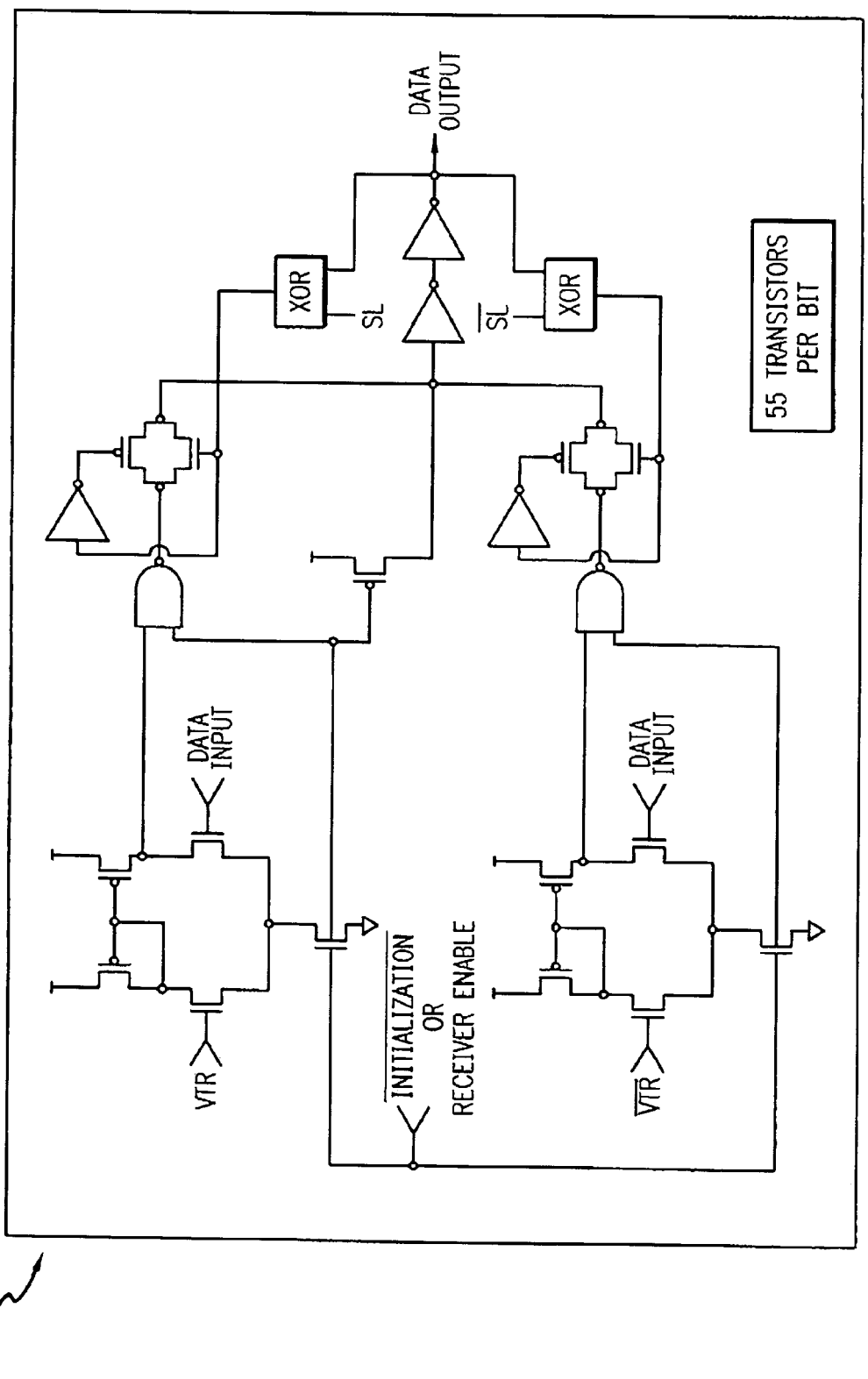
FIG. 5 is a circuit diagram of a receiver for signals and data of both the controller and the DRAMs.

FIG. 5 is a circuit diagram showing a bit receiver 500 for receiving the data, address or command signal and is explained and incorporated by reference in an earlier patent application Ser. Nos. 09/057,158 and 09/165,705, which are currently pending. The Receiver Enable signal is used to preset the output high and disable the receiver from acting on changes on the VTR and DATA pins.

Figure 6:
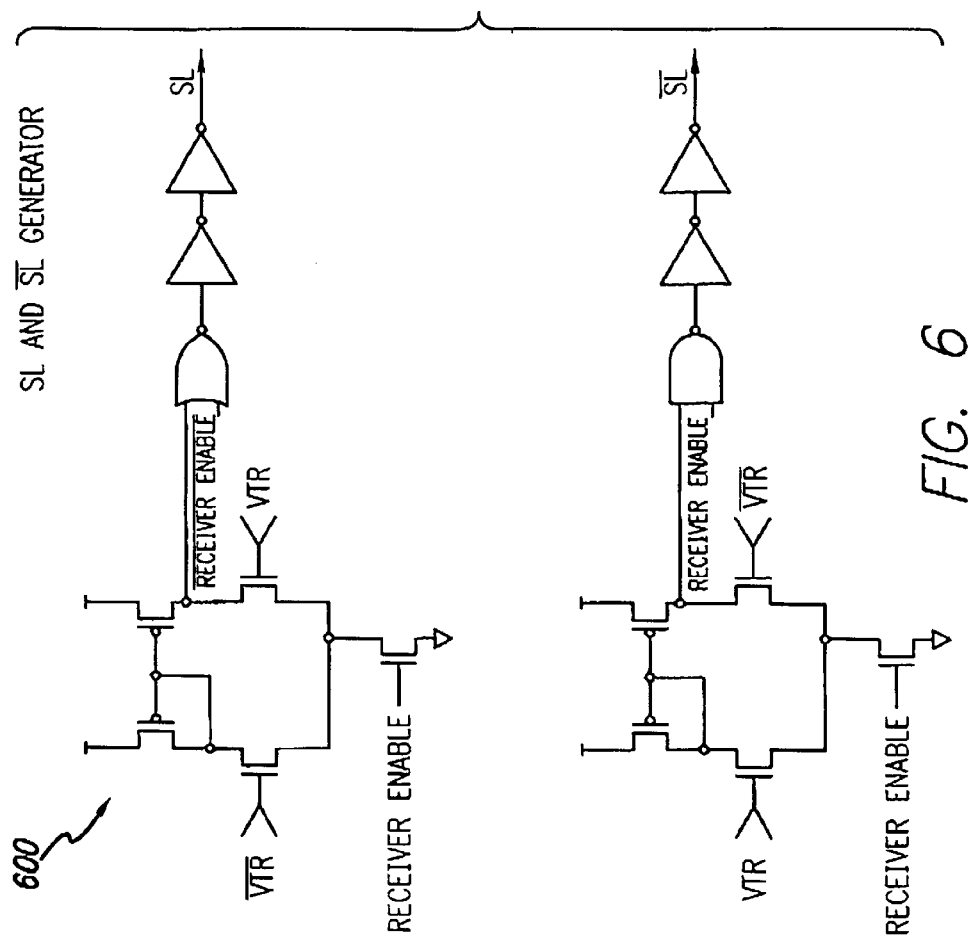
FIG. 6 is a circuit diagram of the VTR and /VTR receiver generating SL and /SL.
Figure 7:
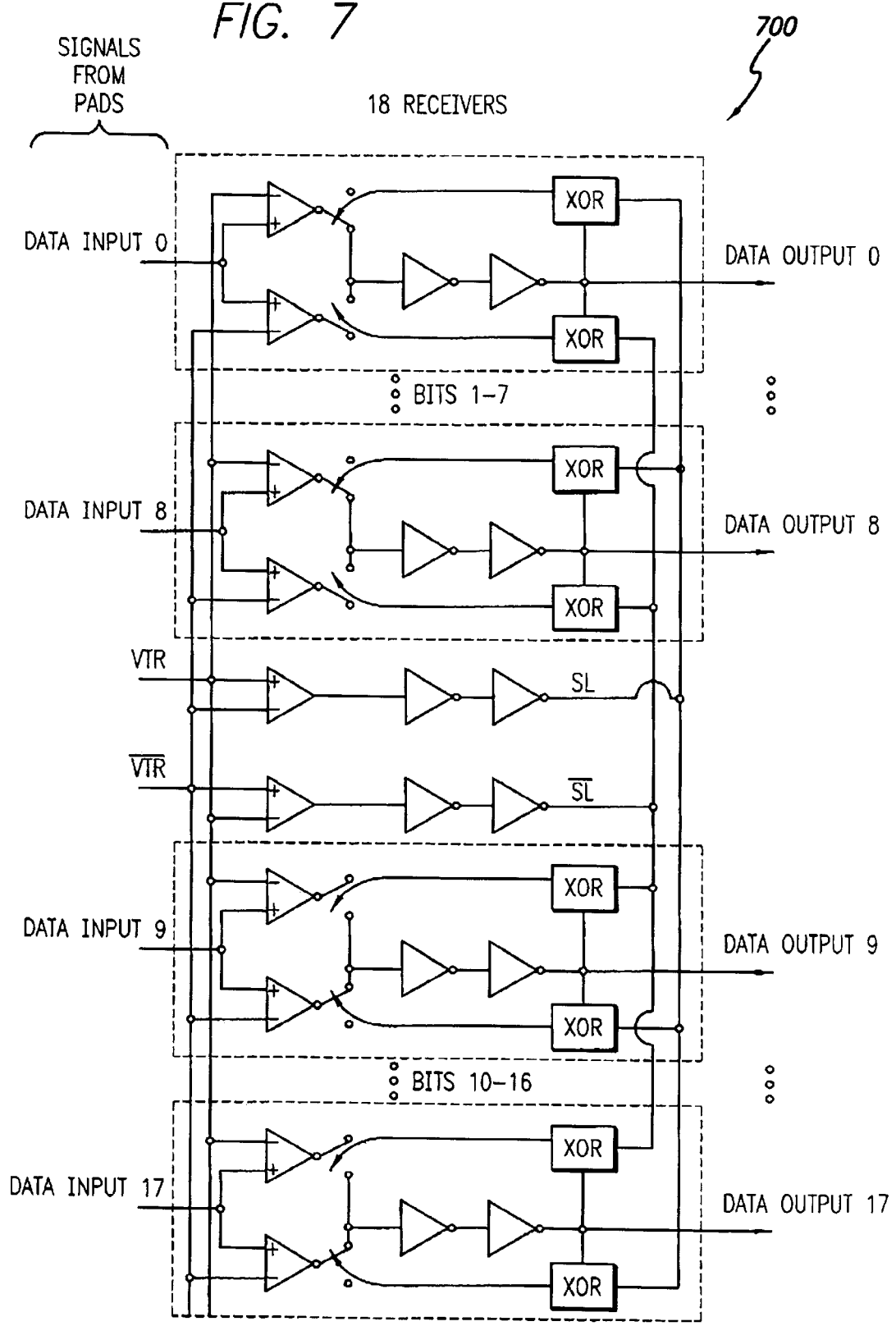
FIG. 7 is a circuit diagram of eighteen (18) receivers sharing the same VTR and /VTR references.

FIG. 6 shows the receiver 600 for VTR and /VTR for use in the steering logic needed to generate the XOR in the bit receiver of FIG. 5. FIG. 7 shows eighteen receivers 700 wherein each VTR and /VTR pair is shared with up to 18 signal or data input. The SL is preset low and /SL is preset high using the Receiver Enable signal. More SL and /SL generators can be inserted using the same VTR and /VTR to reduce loading on SL and /SL or to better match delay if required.

Figure 8:
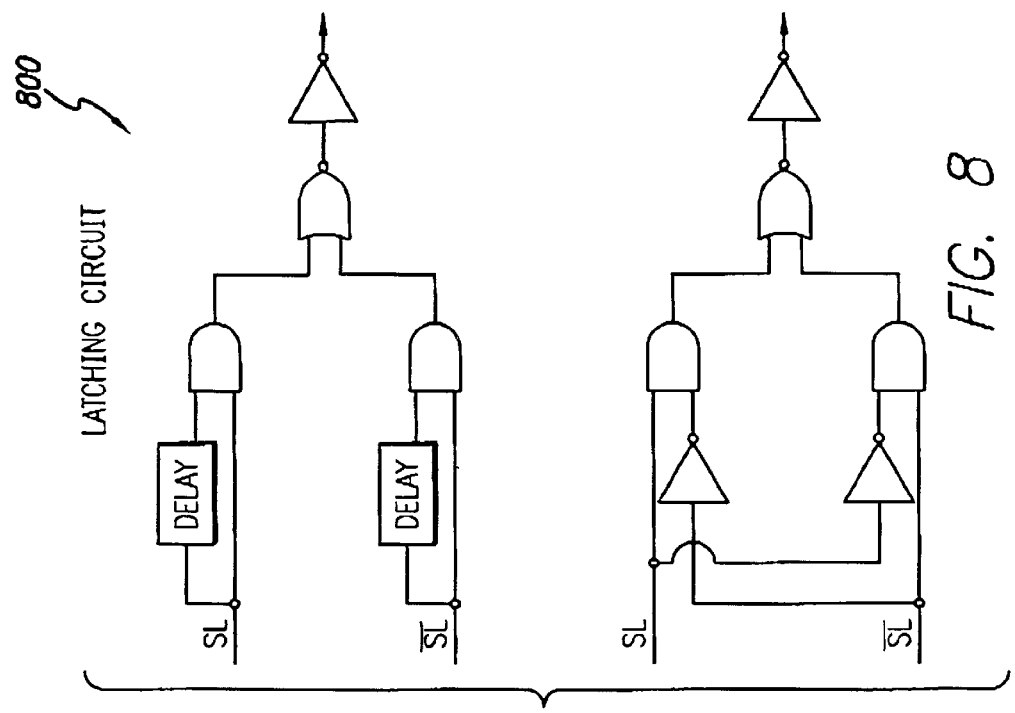
FIG. 8 is a circuit diagram of a latching circuit for latching on every transition of SL and /SL.

FIG. 8 shows circuits 800 that latches the address and control inputs by using VTR0 and /VTR0 signals on both the transitions. These circuits 800 generate a pulse of short duration to latch the received data from the bit receiver. For higher signal rates, the 2-bit address and control may be converted from serial two bits to parallel on even and odd cycle of VTR before latching.

Figure 9:
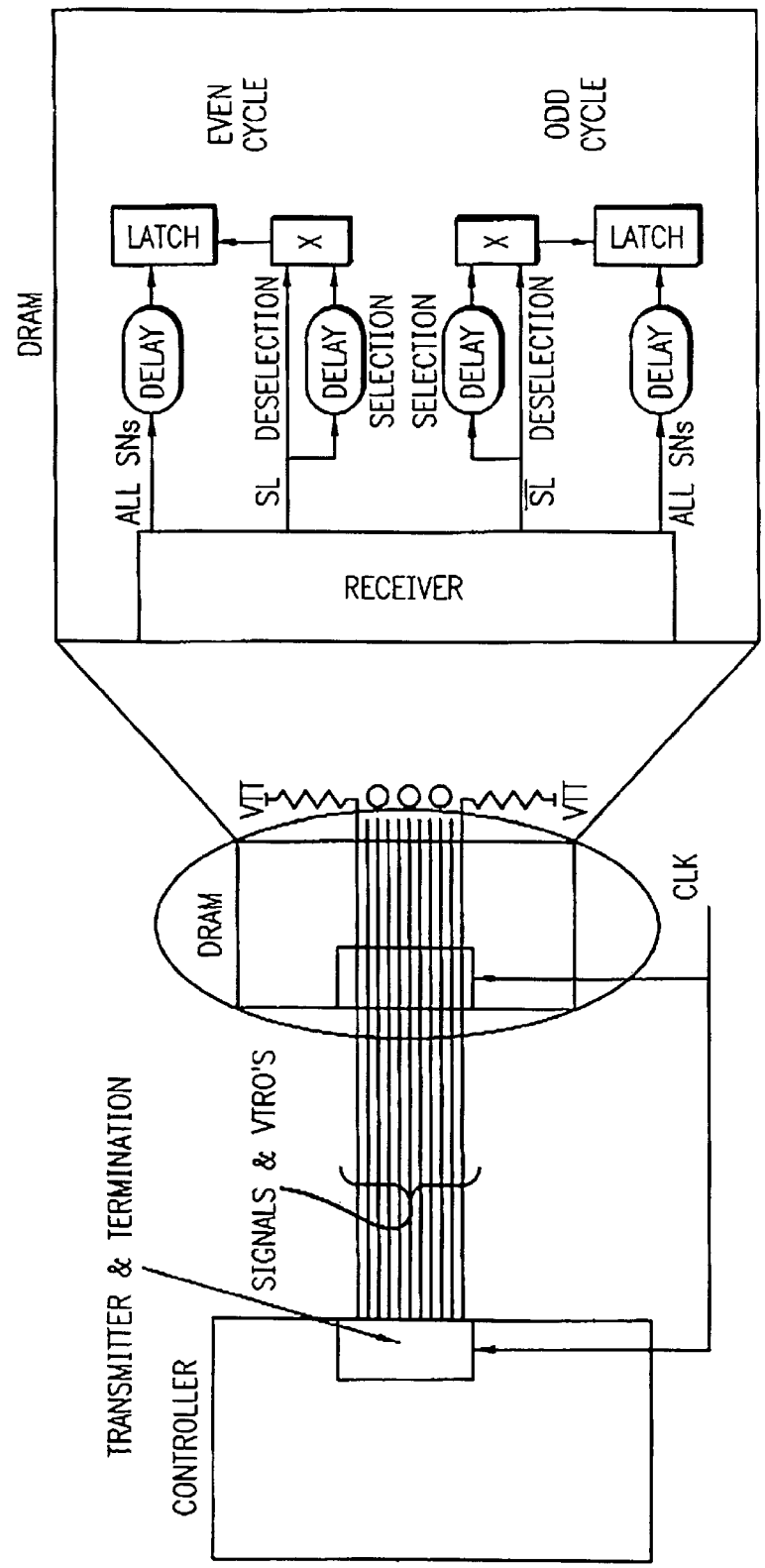
FIG. 9 is a block diagram of control and address signal latching in the DRAM with 2-bit serial-to-parallel conversion.

FIG. 9 shows SL being used for even cycle by an AND gate (NAND and inverter as shown with "X" in the box) with appropriate delay for a finite pulse width to latch the address or command bit from the receiver using CMOS transmission gates. Similarly the next bit on the following edge is latched using /SL. This allows for the core logic beyond the latch to operate at half the frequency of the interface. Since the address and command can be initiated on every cycle, the VTR0 and /VTR0 are occurring on every cycle on both the clock edges. Therefore the Receiver Enable normally occurs at power up only and no-ops are sent with the command signals without any transition in address signals when the DRAM is idle.

The VTR1 and /VTR1 are bi-directional and change the source every time there is a turnaround from read to write or write to read or read to read from different slaves. The signal receiver and the VTR receiver are the same but the signal receivers need to be initialized every time the transmitting source changes. The controller 105 generates the Receiver Enable signal for DRAM reads when it is receiving data. The controller 105 is aware of the read request and the burst length coming from the DRAM 130. At the end oh the burst, the controller 105 asserts Receiver Enable signal low to preset the bit receiver 500 of FIG. 5 and VTR1 receiver 600 of FIG. 6. Since the data is coming from multiple DRAMs 130 and since there are more I/O pins than address and command pins, the skew is usually more on the data than on address and control signals. Also, the data rate is usually faster than the address and control signal rate for higher system performance.

Accordingly, it is desirable to convert the serial data burst on every pin to four bit parallel to allow sufficient time to latch the data for higher data rates. FIG. 10a is a timing diagram that shows the latching of signals generated from SL and /SL for the four-bit serial-to-parallel conversion. The SL and /SL are converted to half their rate by dividing them with a flip flop 1005 (FIG. 10b) on the positive edge of SL to generate SLD2 and SLD2. The Receiver Enable is used to reset the flip-flop 1005, so that /SLD2 becomes high as soon as the Receiver Enable goes low. SLL0, SLL1, SLL2 and SLL3 are generated as shown in FIGS. 10c and 10d with their timing relationships shown in FIG. 10a. The data from the receiver is available at their respective outputs D0 (Data Output 0) etc, at the same time as SL and /SL as shown in the FIG. 7.

Figure 11:
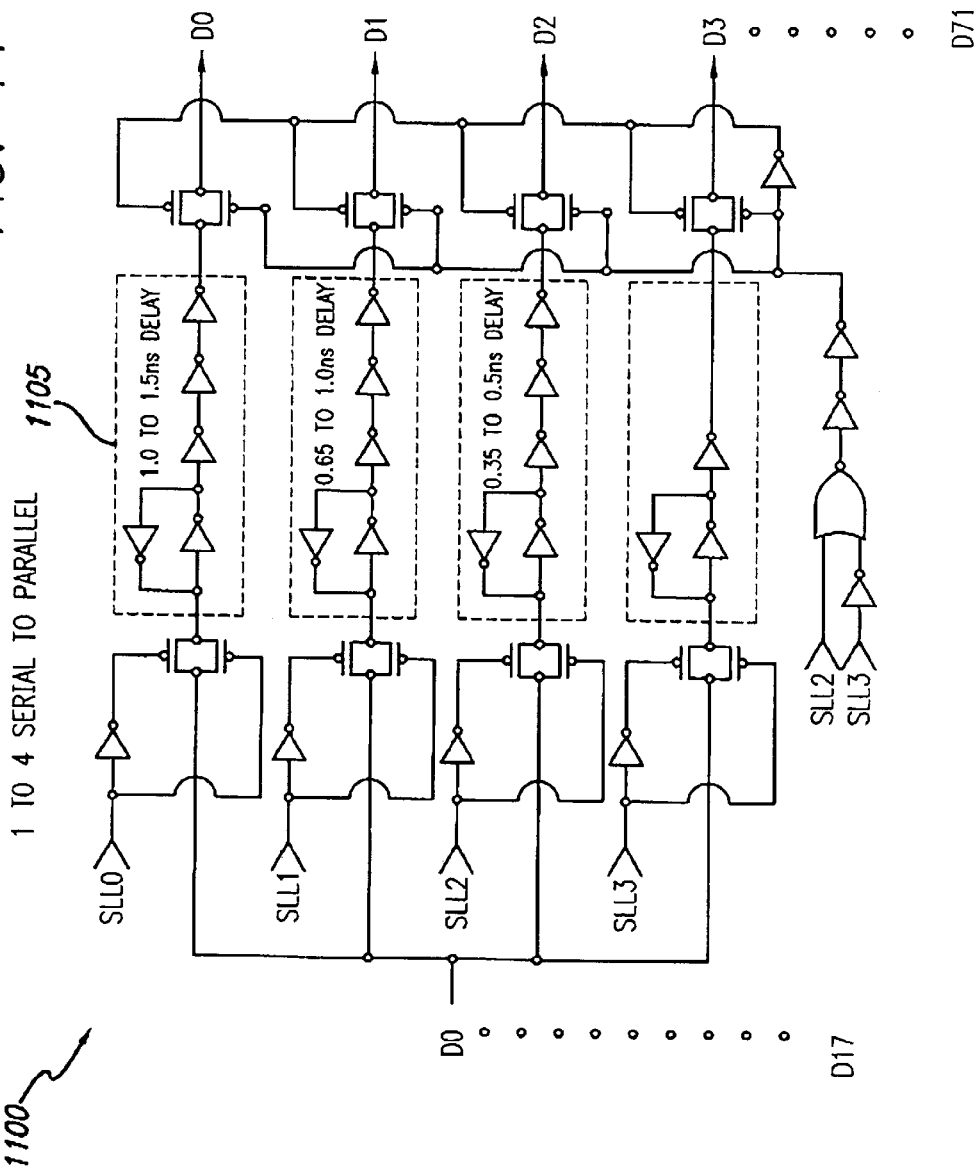
FIG. 11 is a circuit diagram of the 4-bit serial-to-parallel converter circuit for DRAM read data in the controller.
Figure 12:
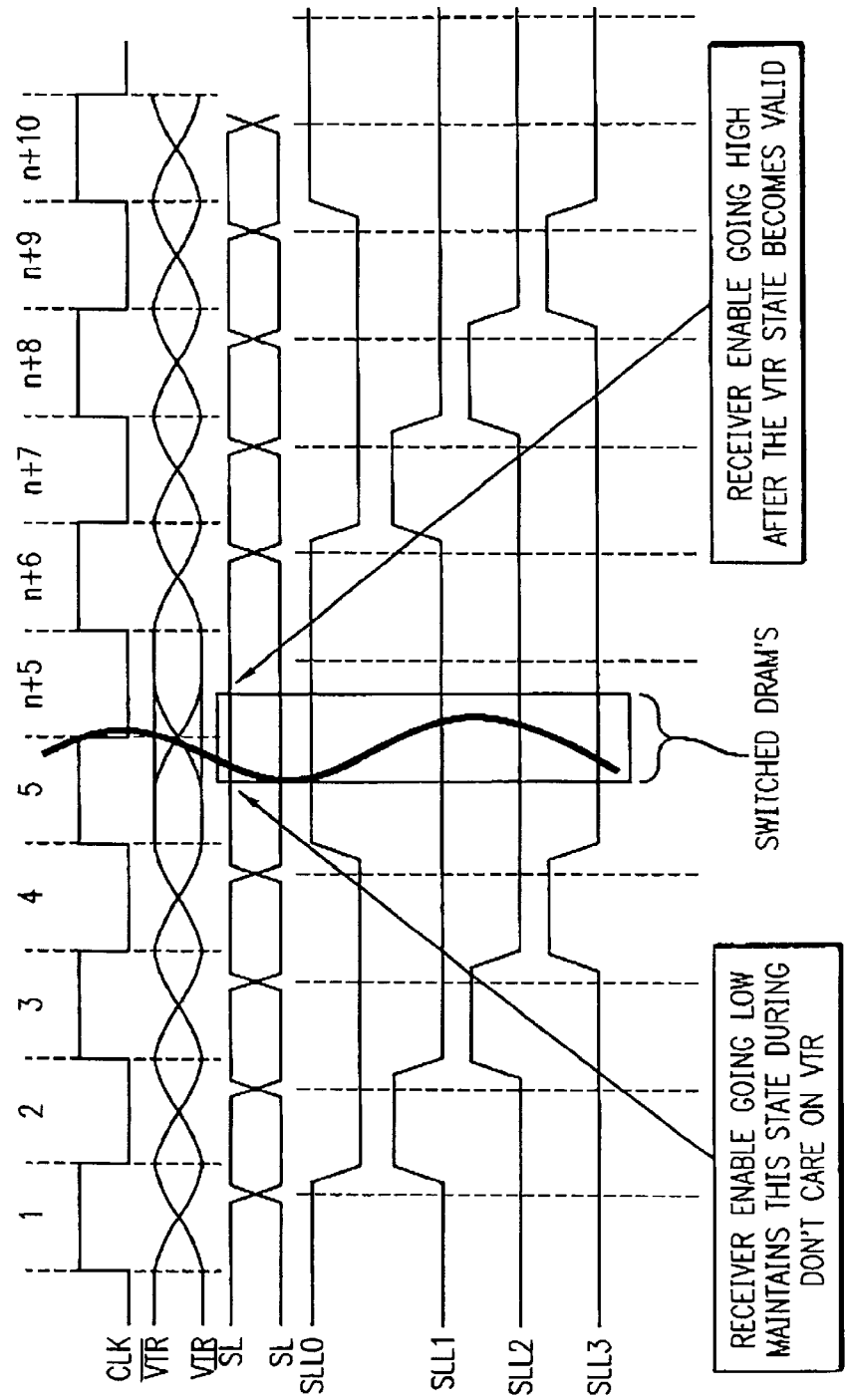
FIG. 12 is a timing diagram of a latch timing wherein the DRAM sending the data is switched or bus turnaround from read to write to read.
Figure 13A:
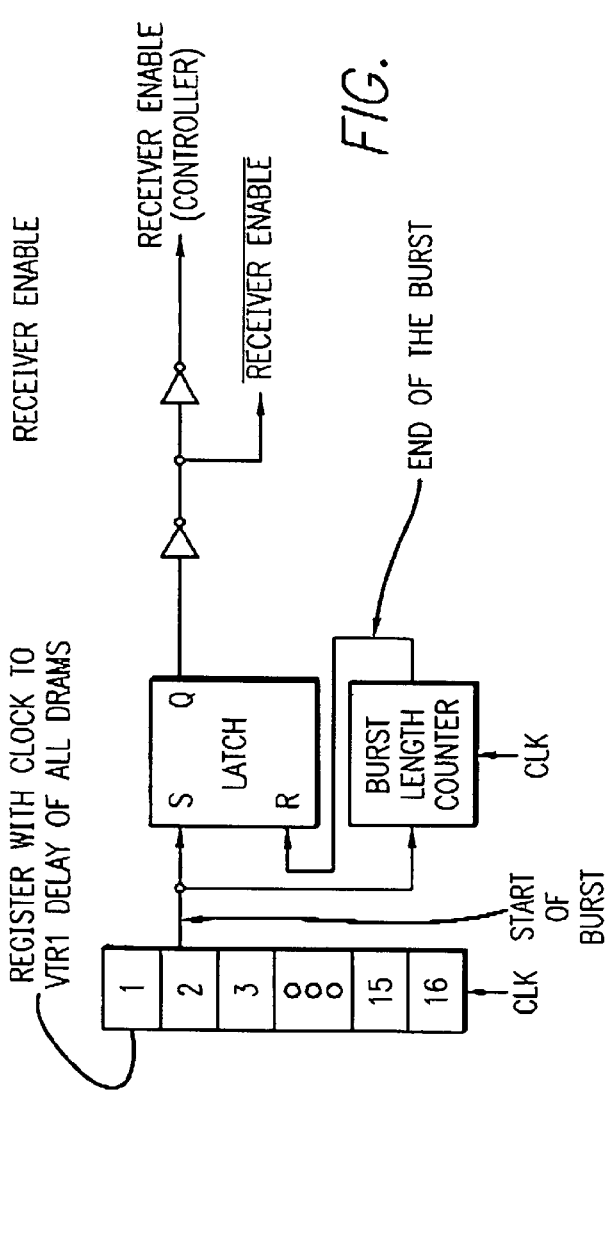
FIG. 13A is a circuit diagram of Controller Receiver Enable.
Figure 13B:
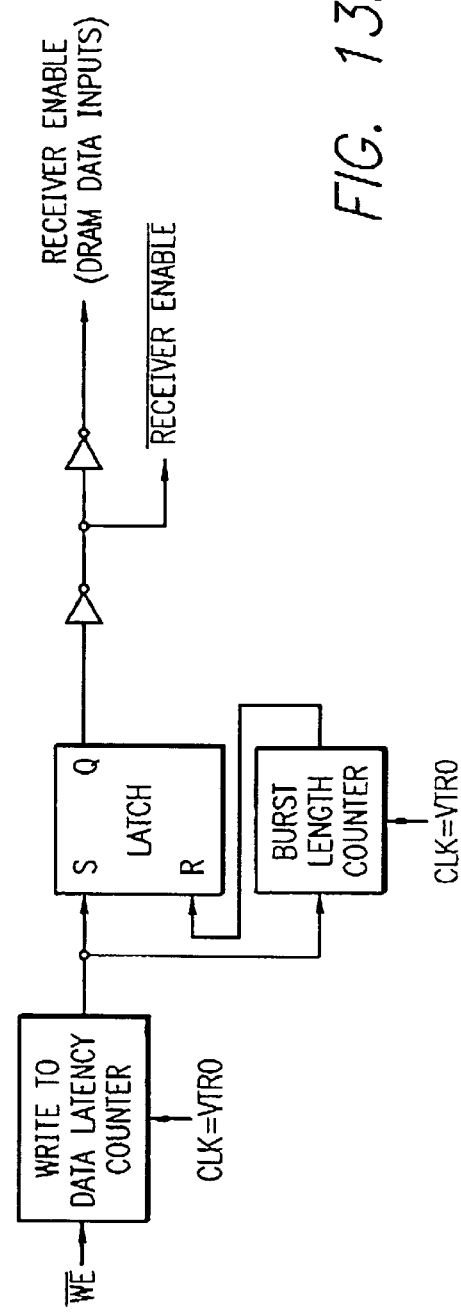
FIG. 13B is the circuit diagram of DRAM data-input Receiver Enable.

FIG. 11 is a circuit diagram illustrating the 4-bit serial-to-parallel converter circuit 1100 for DRAM read data in the controller. SLL0 going low latches the first output of the data burst, followed by SLL1 capturing the second bit of the data burst, and so on until the fourth bit is captured by SLL3. The small inverters 1105 create a delay after the SLL0 latch to assure that data stays valid when the fifth bit is ready to come through SLL0 and to assure that the first four bits of the burst are passed forward to the following stage at the same time. The inverters 1105 in the delay lines may be a narrow width and long length stack of p-channel and a stack of n-channel devices for low variation, low power delay elements as widely used in the industry. The delay in the SLL0 path is one to one half-clock cycle times or two to three times the data rate. All the other output bursts are similarly converted using the same SLL0 through SLL3 (or logically same SLL0 through SLL3) to have 72 bits of data available in parallel at the second set of transmission gates of FIG. 11. The 72 bits are latched by using a short pulse generated after SLL2 goes low and SLL3 goes high plus a delay of a NOR gate and two inverters. The short pulse goes low after SLL3 goes low and a delay of a NOR gate and two inverters. This 4-bit serial to parallel conversion is useful for bursts that are a multiple of 4 bits and allows lower frequency operation beyond the second set of transmission gates. If the burst is only four bits long, then the controller 105 disables the receiver after the fourth bit using the Receiver Enable signal, and forces the SL signal low, the /SL signal high, the SLD2 signal low and the /SLD2 signal high. As shown in the FIG. 12, this will make SLL0 signal high. SLL0 will remain high until the next time the controller expects read data from the DRAMs to occur and the VTR1 and /VTR1 transition. Since in this embodiment the memory controller 105 is the master, the memory controller 105 has the information about burst length and data arrival time, and can generate the Receiver Enable well within a cycle time. It can also use a register if the data comes from different slaves at different delays within the cycle time to fine tune when the Receiver Enable is asserted high. The register can store delay between the clock and the VTR1 signal from every DRAM (16 DRAMs are shown in the example of FIG. 13A.) The DRAMs 130 can use a DLL to reduce the variation in the data arrival time from the different DRAMs 130 at the controller 105. Also the DRAM 130 can drive the VTR1 low and the /VTR1 high for a cycle time to make sure that once the Receiver Enable is asserted high, all transitions on the DATA, VTR1 and /VTR1 are valid. As shown in FIG. 13B, the Receiver Enable on the DRAM write cycle is done similarly inside the DRAM 130. This is based on DRAM write latency, which is ten cycles in the example shown in FIG. 3 and the clock used to count is the SL based on VTR0s. The delay generating the SL is subtracted to have the receiver Enable high before the write data to the DRAM is available at the data pins. The burst length counter determines the end of the write data burst, and the Receiver Enable is reset low turning off the data input receiver. As shown in FIG. 14, if the read burst is longer and a multiple of 4 bits, the SLL0 through SLL3 repeat the sequence while the data is loaded every two cycles or 4 bit data rate into the latch.

Figure 15:
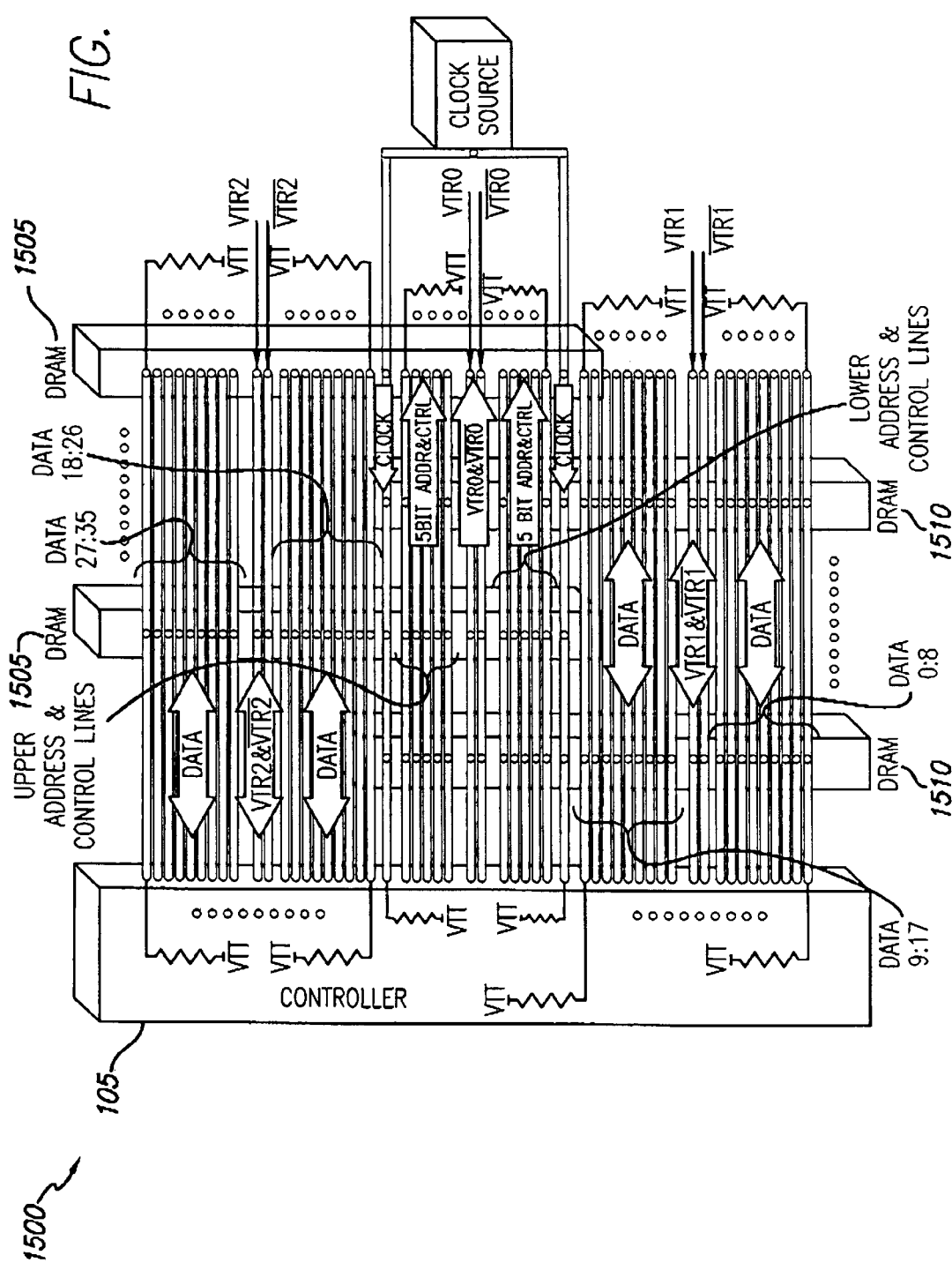
FIG. 15 is block diagram of a wide memory system.
Figure 16:
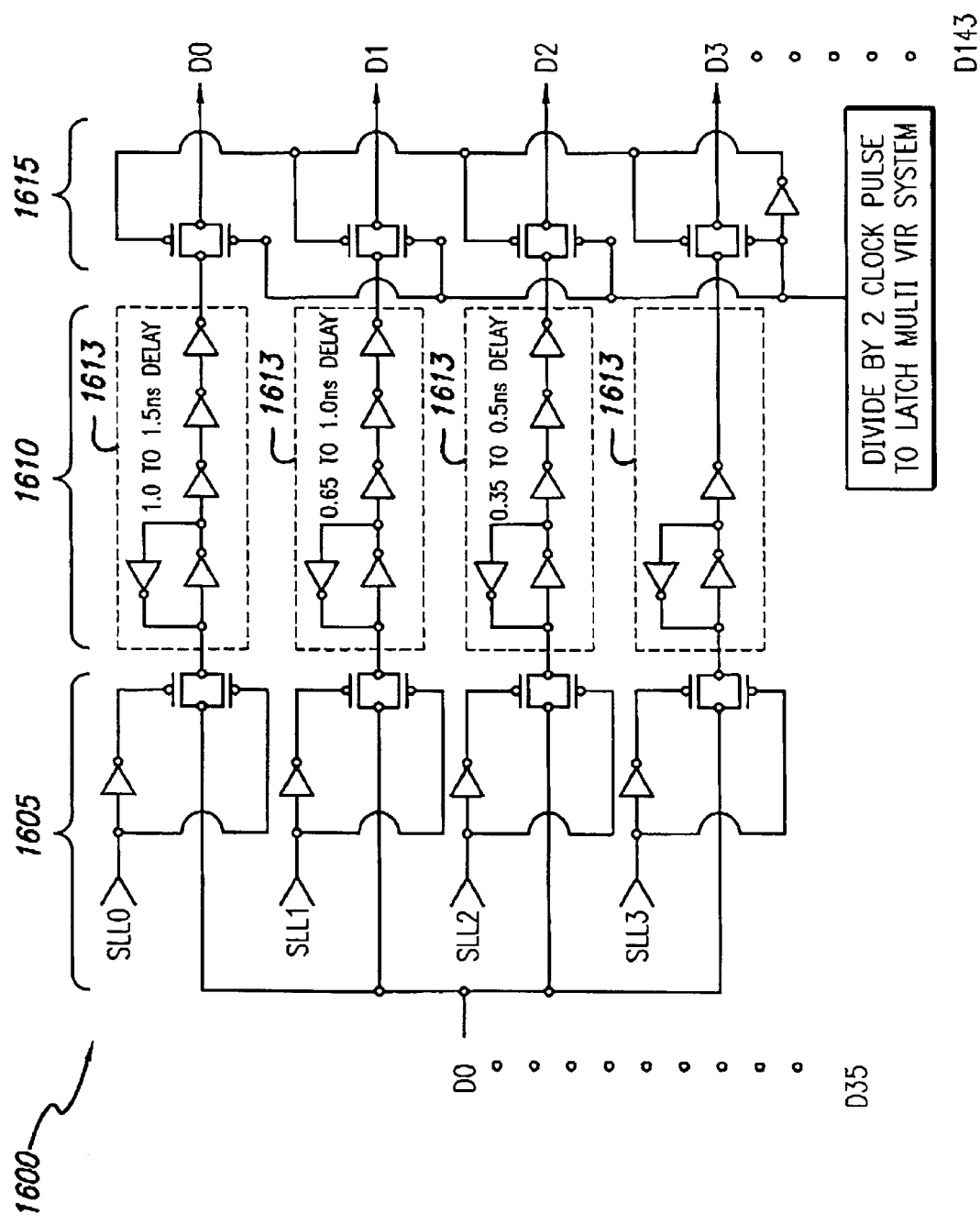
FIG. 16 is a circuit diagram of a 4-bit serial-to-parallel converter circuit for DRAM read data in the wide memory system of FIG. 15.

As shown in FIG. 15, the wider data path using two-DRAM busses for 36 bit wide data. The VTR0 and /VTR0 is shared between both DRAM busses for address and command signals. The upper DRAM data bus uses VTR2 and /VTR2 and the lower DRAM bus uses VTR1 and /VTR1. The latching is same for address, command and DRAM write as the single DRAM bus case discussed earlier, but the DRAM read is different since the controller 105 has to latch 36 bits with skew between different DRAMs 1505/1510 on the top or bottom DRAM busses. The serial-to-parallel converter is similar except the final latching of 144 bits in parallel is done on the clock edge as shown in FIG. 16. FIG. 16 is a block diagram illustrating a circuit diagram of a 4-bit serial-to-parallel converter circuit 1600 for DRAM read data in the wide memory system 1500 of FIG. 15. Circuit 1600 includes a first stage 1605 for latching the incoming data bits at the signal rate, and thus converting the four serial incoming bits to four parallel bits on four different bit lines. The SLL0 through SLL3 for each of the 18 bits coming from each DRAM bus is generated separately using VTR1s and VTR2s respectively. The second stage 1610 includes delays 1613 for delaying the four parallel bits relative to their position in the stream, so that the parallel bits arrive at the third stage 1615 at approximately the same time. The third stage 1615 includes latches for latching the four parallel bits arriving from the second stage 1610. The final latching is done by the clock, whose time can be adjusted with a Vernier using well-known techniques to optimize the latching window for skews between different DRAM busses. The final latching may divide the clock pulse by two to latch the multiple VTR system.

Figure 17:
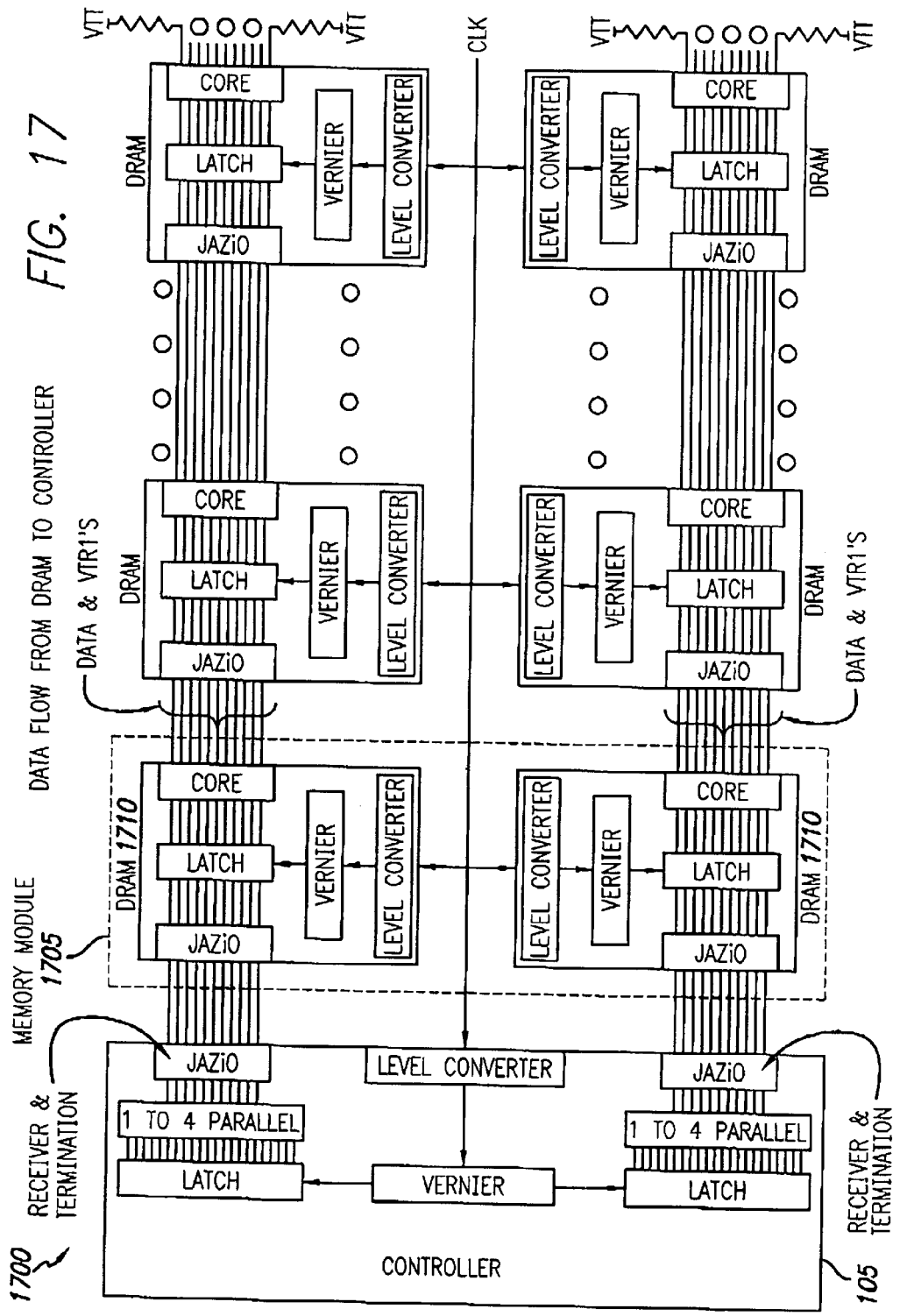
FIG. 17 is a block diagram illustrating data flow between parallel DRAMs and a Controller in the wider memory system.

FIG. 17 is a block diagram illustrating a circuit 1700 having the controller 105 connected to a series of memory modules 1705, each memory module 1705 containing two DRAM components 1710, possibly from different manufacturers with different characteristics. Each "JAZiO" in the element 1710 refers to all the signal drivers. Each "JAZiO" in the controller 105 refers to all the signal receivers. The data flows from the dual DRAM busses to Controller 105. The clock enables the data output driver from every DRAM 1710 and is travelling with the data and VTRs towards the controller 105. The board layout is matched to minimize skews between clock, data and VTRs using well known techniques for high frequency operation. The Vernier is to adjust for different driving capabilities of multiple DRAM components 1710 and can be adjusted during power up to better match and reduce the skew.

Figure 18:
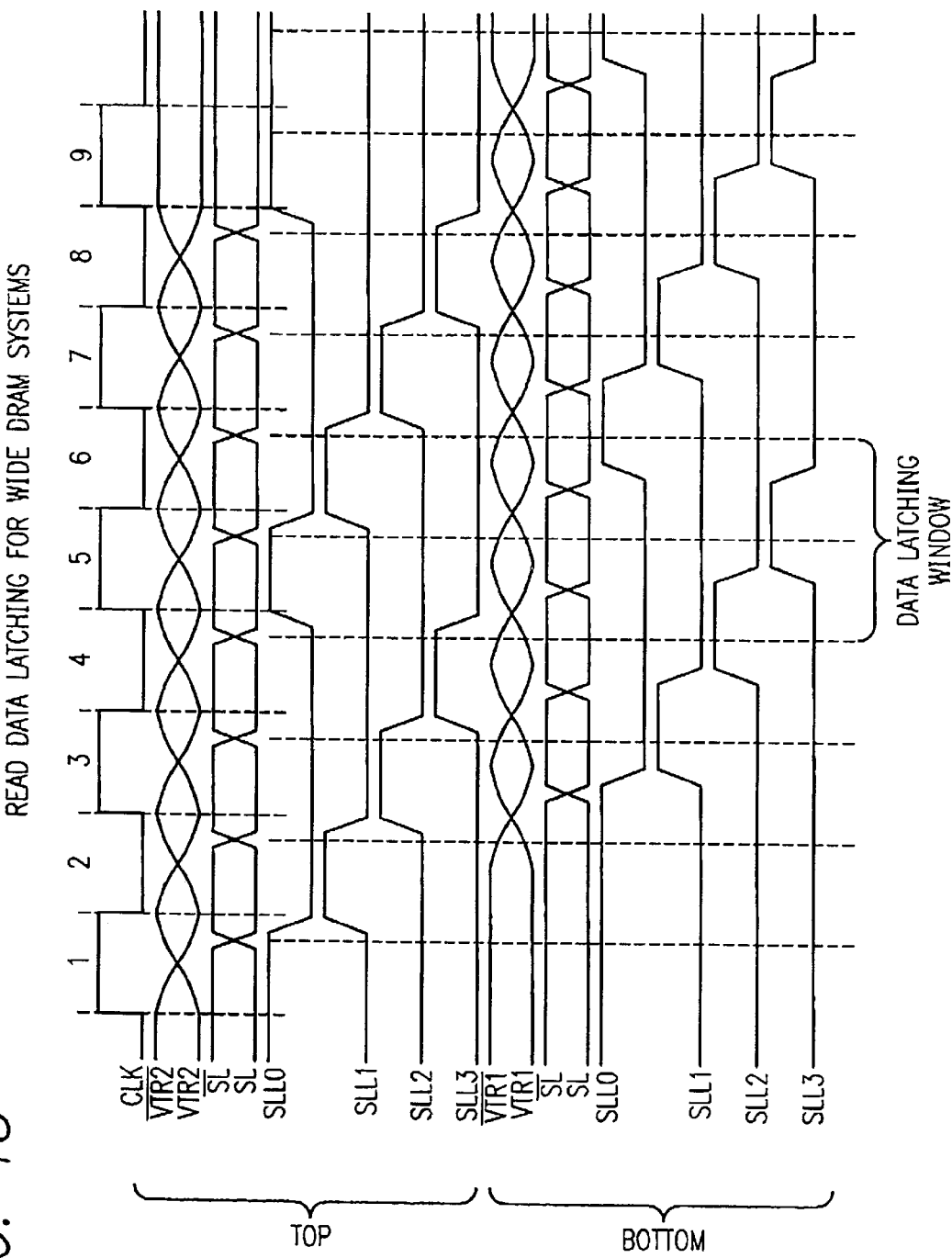
FIG. 18 is a timing diagram and data latching window with more than data rate skew between the top and bottom DRAMs for the data arriving at the controller.

The timing of the both the top and bottom DRAM busses and the skew between them are shown in FIG. 18. In this example, the bottom DRAM bus is late by less than about ¾ the cycle time or 1.5 times the data rate. The SLL0 through SLL3 for top and bottom latch D0–D17 and D18–D35 respectively as before as the skew within the top and bottom busses is much less than skew between top and bottom busses. The data is latched by dividing the clock signal by 2 and using the delayed version of clock period 4 and 5 to latch all the 144 signals as in FIG. 16. Thus the 1-to-4 serial-to-parallel converter using the individual VTRs to convert the respective data bits to operate at high frequency with skew between different DRAM components 1710 being more than the data rate. Alternatively each DRAM component may have multiple VTRs (VTR1, /VTR1, VTR2, /VTR2) and they each generate D0–D17 and D18/D35 respectively. The combined 144 bit after the 1-to-4 serial-to-parallel conversion of DO-D35 can be latched by Or-ing the latch enable circuit of the second set of transmission gates of FIG. 11 or by using the clock similar to FIG. 16.

FIG. 19 is a block diagram illustrating an example circuit 1900 for performing a one-to-four serial-to-parallel conversion in a system having skew between components greater than the signal rate. In this example, the signal rate is shown as one bit every 0.5 nanoseconds (for a system operating at 2 gigahertz). The skew between the upper and lower components is 1.0 nanoseconds, which is greater than the signal rate. As is known in the art, this skew can be attributed to variations in the characteristics of the DRAM components, either because of same manufacturer tolerances or different manufacturer configurations. Since the skew is greater than the data rate, the controller may lose data being received from different DRAM components of a single memory module.

In the upper portion 1930 of the circuit 1900, the first four bits of data being read arrive at 6.0 nanoseconds, 6.5 nanoseconds, 7.0 nanoseconds, and 7.5 nanoseconds. In the lower portion 1935 of the circuit 1900, the first four bits of data being read arrive at 7.0 nanoseconds, 7.5 nanoseconds, 8.0 nanoseconds, and 8.5 nanoseconds. In order to latch all data by latches 1915 and 1965 and transmit the data in the upper and lower portions at the same time, the circuit 1900 effects one-to-four bit serial-to-parallel conversion and bit delays. The upper portion of the circuit 1900 uses delays 1910 to delay the first bit of data 1.5 nanoseconds, the second bit 1.0 nanoseconds, the third bit 0.5 nanoseconds, and the fourth bit 0 nanoseconds before latching by latch 1915. The lower portion of the circuit 1900 uses delays 1960 to effect the same delays before latching by latch 1965. Accordingly, the latches 1915 and 1965 latch all bits by 8.5 nanoseconds (in this case defined by the lower portion 1935).

The latches 1915 and 1965 can transmit the signals at 9.0 nanoseconds. The next earliest signal that could overwrite a previous signal before transmission arrives at 9.5 nanoseconds. The data is therefore safe.

The number (n) of bits to convert from serial to parallel is determined from the computation of 2*(skew)/(data rate), which defines the minimum number of bits. In this case, the computation yields a minimum number of 2*(1.0 ns)/(0.5 ns), or four. The number n of bits to convert to parallel is preferably selected as the nearest multiple of $2^x$, without going lower than the minimum. In this case, since four is a multiple of $2^x$, n is selected to be four. It will be appreciated that the values used for skew and data rate are typically design values. It will be appreciated that the number of bits to convert from serial to parallel can be the same for all machines that use components with characteristics that vary within set thresholds, e.g., from the same manufacturer and that vary within a known percentage of specification. One skilled in the art will know to apply worst case scenario values. One skilled in the art will know that the design should account for noise and other fudge factors.

The foregoing description of the preferred embodiments of the present invention is by way of example only, and other variations and modifications of the above-described embodiments and methods are possible in light of the foregoing teaching. The embodiments described herein are not intended to be exhaustive or limiting. The present invention is limited only by the following claims:

What is claimed is:

1. A system, comprising:
   a first port for serially receiving a first signal at a signal rate from a first component;
   a second port for serially receiving a second signal at the signal rate from a second component; and
   a serial-to-parallel conversion circuit for performing serial-to-n-bit-parallel conversion of the first signal, n being greater than one.

2. The system of claim 1, wherein a skew between the first signal and the second signal is greater than the signal rate, and n is selected to step the signal rate down to a time which is greater than the skew.

3. The system of claim 1, wherein n is selected to step the signal rate down to that of a known clock rate.

4. The system of claim 1, wherein the system is part of a memory controller.

5. The system of claim 1, wherein the first component includes a first DRAM in a memory module.

6. The system of claim 5, wherein the second component includes a second DRAM in the memory module.

7. The system of claim 1, wherein the serial-to-parallel conversion circuit includes n latches for latching n bits of the first signal.

8. The system of claim 7, wherein the serial-to-parallel conversion circuit includes n delays, each delay coupled to a respective one of the n latches, each delay for delaying the corresponding one of the n bits an amount of time.

9. The system of claim 8, wherein the amount of time is determined based on the position of the bit and on the signal rate.

10. The system of claim 8, wherein the serial-to-parallel conversion circuit includes n latches for latching the n bits after the delay, each latch coupled to a respective one of the n delays.

11. The system of claim 1, further comprising a second serial-to-parallel conversion circuit for performing serial-to-n-bit-parallel conversion of the second signal.

12. The system of claim 2, wherein the signal rate and the skew are design values.

13. A system, comprising:
   means for serially receiving a first signal at a signal rate from a first component;
   means for serially receiving a second signal at the signal rate from a second component; and means for performing serial-to-n-bit-parallel conversion of the first signal, n being greater than one.

14. A method, comprising:
serially receiving a first signal at a signal rate from a first component;
serially receiving a second signal at the signal rate from a second component; and
performing serial-to-n-bit-parallel conversion of the first signal, n being greater than one.

15. The method of claim 14, wherein a skew between the first signal and the second signal is greater than the signal rate, and n is selected to step the signal rate down to a time which is greater than the skew.

16. The method of claim 14, wherein n is selected to step the signal rate down to that of a known clock rate.

17. The method of claim 14, wherein the method is performed by a memory controller.

18. The method of claim 14, wherein the first component includes a first DRAM in a memory module.

19. The method of claim 18, wherein the second component includes a second DRAM in the memory module.

20. The method of claim 14, further comprising latching n bits of the first signal.

21. The method of claim 20, further comprising delaying each of the n bits an amount of time.

22. The method of claim 21, wherein the amount of time is determined based on the position of the bit and on the signal rate.

23. The method of claim 21, further comprising latching the n bits after the delay.

24. The method of claim 14, further comprising performing serial-to-n-bit-parallel conversion of the second signal.

25. The system of claim 15, wherein the signal rate and the skew are design values.

26. A system, comprising:
a first port for serially receiving a first signal at a signal rate from a first component;
a second port for serially receiving a second signal at the signal rate from a second component; and
a first serial-to-parallel conversion circuit coupled to the first port for performing serial-to-parallel conversion of n bits of the first signal onto n bit lines, n being greater than one, the serial-to-parallel conversion circuit including
a first set of n delays, each delay coupled to a successive one of the n bit lines, each delay configured to delay its corresponding bit of the n bits; and
a first set of latches coupled to the n delays for latching the n bits.

27. The system of claim 26, further comprising
a second serial-to-parallel conversion circuit coupled to the second port for performing serial-to-parallel conversion of n second bits of the second signal onto n second bit lines, the second serial-to-parallel conversion circuit including
a second set of n delays, each delay coupled to a successive one of the n second bit lines, each delay configured to delay its corresponding second bit of the n second bits; and
a second set of latches coupled to the second set of n delays for latching the n second bits.

28. A system, comprising:
means for serially receiving a first signal at a signal rate from a first component;
means for serially receiving a second signal at the signal rate from a second component; and
means for performing serial-to-parallel conversion of n bits of the first signal onto n bit lines, n being greater than one, the means for performing including means for delaying each of the n bits an amount of time and means for latching the n bits.

29. A method, comprising:
serially receiving a first signal at a signal rate from a first component;
serially receiving a second signal at the signal rate from a second component;
performing serial-to-parallel conversion of n bits of the first signal onto n bit lines, n being greater than one;
delaying each of the n bits an amount of time; and
latching the n bits.

30. The method of claim 29, further comprising
performing serial-to-parallel conversion of n second bits of the second signal onto n second bit lines, the performing the second serial-to-parallel conversion including delaying each of the n second bits an amount of time and latching the n second bits.

* * * * *